US005548773A

United States Patent [19]

Kemeny et al.

[11] Patent Number: 5,548,773
[45] Date of Patent: Aug. 20, 1996

[54] DIGITAL PARALLEL PROCESSOR ARRAY FOR OPTIMUM PATH PLANNING

[75] Inventors: Sabrina E. Kemeny; Eric R. Fossum, both of La Crescenta; Robert H. Nixon, Shadow Hills, all of Calif.

[73] Assignee: The United States of America as represented by the Administrator of the National Aeronautics and Space Administration, Washington, D.C.

[21] Appl. No.: 42,486

[22] Filed: Mar. 30, 1993

[51] Int. Cl.⁶ .......................... G06F 15/00; G06F 15/20
[52] U.S. Cl. ................................. 395/800; 364/DIG. 1; 364/DIG. 2; 364/443; 364/444; 364/467
[58] Field of Search ...................... 395/800; 364/DIG. 1, 364/DIG. 2, 443, 444, 467

[56] References Cited

U.S. PATENT DOCUMENTS

| | | | |
|---|---|---|---|
| 3,558,868 | 1/1971 | Sauvan et al. | 235/185 |
| 3,974,481 | 8/1976 | Ledieu et al. | 340/172.5 |
| 4,435,760 | 3/1984 | Kuno et al. | 364/444 |
| 4,570,227 | 2/1986 | Tachi et al. | 364/444 |
| 4,812,990 | 3/1989 | Adams et al. | 364/444 |
| 4,821,192 | 4/1989 | Taivalkoski et al. | 364/424 |
| 4,847,615 | 7/1989 | McDonald | 340/825.02 |
| 4,858,147 | 8/1989 | Conwell | 364/513 |
| 4,862,373 | 8/1989 | Meng | 364/444 |
| 4,905,144 | 2/1990 | Hansen | 364/200 |
| 4,962,458 | 10/1990 | Verstraete | 364/443 |
| 5,043,902 | 8/1991 | Yokoyama et al. | 364/449 |
| 5,050,096 | 9/1991 | Seidman | 364/513 |
| 5,105,424 | 4/1992 | Flaig et al. | 370/94.1 |
| 5,168,572 | 12/1992 | Perkins | 395/800 |
| 5,220,497 | 6/1993 | Trouato et al. | 364/167.01 |
| 5,272,638 | 12/1993 | Martin et al. | 364/444 |

OTHER PUBLICATIONS

C. R. Carroll, "a Neural Processor for Maze Solving," *Analog VLSI Implementation of Neural Systems,* Kluwer Academic Publishers, Boston (1989).

*Primary Examiner*—Tod R. Swann
*Assistant Examiner*—Valerie Darbe
*Attorney, Agent, or Firm*—John H. Kusmiss

[57] ABSTRACT

The invention computes the optimum path across a terrain or topology represented by an array of parallel processor cells interconnected between neighboring cells by links extending along different directions to the neighboring cells. Such an array is preferably implemented as a high-speed integrated circuit. The computation of the optimum path is accomplished by, in each cell, receiving stimulus signals from neighboring cells along corresponding directions, determining and storing the identity of a direction along which the first stimulus signal is received, broadcasting a subsequent stimulus signal to the neighboring cells after a predetermined delay time, whereby stimulus signals propagate throughout the array from a starting one of the cells. After propagation of the stimulus signals throughout the array, a master processor traces back from a selected destination cell to the starting cell along an optimum path of the cells in accordance with the identity of the directions stored in each of the cells.

56 Claims, 7 Drawing Sheets

DIGITAL PARALLEL PROCESSOR ARRAY FOR OPTIMUM PATH PLANNING

BACKGROUND OF THE INVENTION

1. Origin of the Invention:

The invention described herein was made in the performance of work under a NASA contract, and is subject to the provisions of Public Law 96-517 (35 USC 202) in which the Contractor has elected not to retain title.

2. Technical Field:

The invention relates to parallel processing arrays and in particular to the application of such arrays to optimum path planning from a starting point to a destination point across a known terrain, and the selection of the optimum path from plural paths.

3. Background of the Invention:

A number of techniques are known in the art for performing path planning. U.S. Pat. No. 4,812,990 employs a "least cost" methodology to path plan, but is a software implementation of mathematical optimization algorithms, and therefore suffers from the disadvantages of being complex and time consuming and requiring large computer resources to implement it. Its method of "weighing" costs relies on the mathematical algorithms and has nothing to do with the "time" delay costs of the present invention.

U.S. Pat. No. 4,570,227 teaches determining the optimum path using a comparator circuit which compares all possible routes. It does not use time delay propagation to measure cost. It also has no ability to scale the cost because it cannot distinguish between a shorter path that is uphill and more time consuming with one that is longer but on a flat grade. Moreover, it is not capable of multiple destination point analysis.

U.S. Pat. No. 4,862,373 provides a method for determining the shortest collision free path through a 3-D space utilizing a set of pre-stored 2-D maps at different altitudes. However, it relies on software implementations of mathematical optimization algorithms, and therefore requires significant computer support hardware. It cannot scale costs and cannot perform multiple destination point analysis.

C. R. Carroll, "A Neural Processor for Maze Solving", Analog VLSI Implementation of Neural Systems, Kluwer Academic Publishers, Boston (1989) discloses a 4×4 array of binary processors allowing for a 2-state "cost scaling" and a 4×8 array for 3-state "cost-scaling". This technique therefore provides a very limited dynamic range of cost scaling for path planning.

Accordingly, it is an object of the invention to perform high speed optimum path planning requiring no software or computer support during operation.

It is a further object of the invention to perform such path planning with many levels (e.g., 256) of programmable costs at each cell in an array representing terrain to be crossed.

It is a yet further object of the invention to perform such path planning on a high speed integrated circuit.

It is a still further object of the invention to perform such path planning simultaneously for multiple destination points.

SUMMARY OF THE DISCLOSURE

The present invention concerns a method for path planning using an array of digital parallel processors in a single integrated circuit chip. This chip may be used for determining the most efficient route between locations in a given terrain. In one exemplary embodiment, the array would consist of 25 rows and 24 columns of processors. Each processor in the array would represent a pixel in an image of the terrain. The difficulty in traversing that portion of the terrain would be assigned one of 256 possible values. The higher the number, the more difficult the terrain is to traverse. These difficulty values, or "costs", for each pixel would be programmed into the corresponding processor or "unit cell" in the array. This is accomplished in one embodiment by an 8-bit ripple counter in the cell. The counter is preset to one of 256 possible values. When activated, it decrements to zero and triggers an output signal from the cell. The cost is thereby equated to the delay in the output signal.

The chip is operated by first selecting one of the cells as the path origination point. That cell then sends a signal to its adjoining cells to the north, east, south and west. The receiving cell stores the direction of the incoming signal and prevents further inputs. At the same time, the receiving cell's counter is activated. This combination of inhibited inputs and signal delays results in a propagation through the array where each cell obtains a preferred (i.e., least cost) direction. By selecting any cell in the array as a destination point and tracing the preferred directions back to the origination cell, the most efficient path is determined. In addition, each cell in the array incorporates a blocking function which prevents signal output in any or all directions. This feature is used to model impassable terrain.

In essence, the invention operates by having many stimulus signals electronically traveling all possible paths simultaneously between two points, detecting the first-to-arrive stimulus signal and determining which path it followed. The stimulus signals emanate from a single starting point and provoke each node or cell in their paths to broadcast copies of each arriving stimulus signal to all adjacent neighboring nodes, until every node in the entire array has received a stimulus signal. Each node blocks the arrival of all but the first-to-arrive stimulus signal and remembers the direction from which that signal arrived. Thus, the invention simultaneously constructs the shortest paths to all nodes in the array from the starting node. After propagation of the stimulus signals throughout the array has ceased, any number of nodes in the array may be selected as destination nodes from which the routes of the first-to-arrive stimulus signals may be traced back to the starting node. Accordingly, the invention provides multiple destination node analysis simultaneously.

One advantage of the invention is that the VLSI digital circuit for path planning described herein operates about three to four orders of magnitude faster than current methods. Another advantage is that optimum paths to multiple destinations may be computed simultaneously with no loss of speed.

The invention computes the optimum path across a terrain or topology represented by an array of parallel processor cells interconnected between neighboring cells by links extending along different directions to the neighboring cells. Such an array is preferably implemented as a high-speed integrated circuit. The computation of the optimum path is accomplished by, in each cell, receiving stimulus signals from neighboring cells along corresponding directions, determining and storing the identity of a direction along which the first stimulus signal is received, broadcasting a subsequent stimulus signal to the neighboring cells after a predetermined delay time, whereby stimulus signals propagate throughout the array from a starting one of the cells.

After propagation of the stimulus signals throughout the array, a master processor traces back from a selected destination cell to the starting cell along an optimum path of the cells in accordance with the identity of the directions stored in each of the cells.

The propagation of the stimulus signals throughout the array is preceded by programming different predetermined delay times in different ones of the cells in accordance with a topology across which the optimum path is to be determined and then causing the selected starting cell to preemptively broadcast a stimulus signal to its neighboring cells. This begins the propagation of stimulus signals throughout the array.

One embodiment of the invention prevents a stimulus signal from being transmitted from the cell along at least a selected one of the directions, whereby to impose an infinite time delay for the selected one direction corresponding to an impassable barrier of the topology.

The array preferably is a network of orthogonal rows and columns of the cells and the neighboring cells connected by the links to an individual one of the cells are adjacent the one cell along one of either orthogonal directions only or orthogonal and diagonal directions. In one embodiment, each cell broadcasts a stimulus signal along the orthogonal directions after the predetermined time delay and broadcasts a stimulus signal along the diagonal directions after an other predetermined time delay different from the predetermined time delay. The other predetermined time delay exceeds the predetermined time delay by a factor equal to a square root of two in a preferred embodiment.

The network may be a two-dimensional network or a three-dimensional network. In the preferred embodiment, the direction memory is implemented by blocking the receipt of any further stimulus signals from any direction upon receipt of the first stimulus signal. In another preferred embodiment, impassable barriers are represented by blocking receipt of any stimulus signals along selected directions.

The programming and the tracing back are carried out in one embodiment by programming a cost memory and infinite cost memory with the time delay and the identification of directions corresponding to impassable barriers, respectively, prior to propagation of stimulation signals throughout the array by a master processor accessing individual cells from row and column decoders and initiating broadcasting of a stimulus signal from the starting cell under control of the master processor. The master processor then reads the stored direction in successive cells in order to trace back the optimum path while constructing a list of the cell locations along the optimum path.

A cell decoder permits the master processor to sequentially programming the cost memory and the infinite cost memory and then to later read of the direction memories of successive cells along the optimum path by applying enabling signals to the cell decoder from the row and column decoders.

Preferably, the invention is implemented on a semiconductor integrated circuit. Three-dimensional embodiments of the invention may employ wafer scale integration techniques.

DETAILED DESCRIPTION OF THE INVENTION

Figure 1:
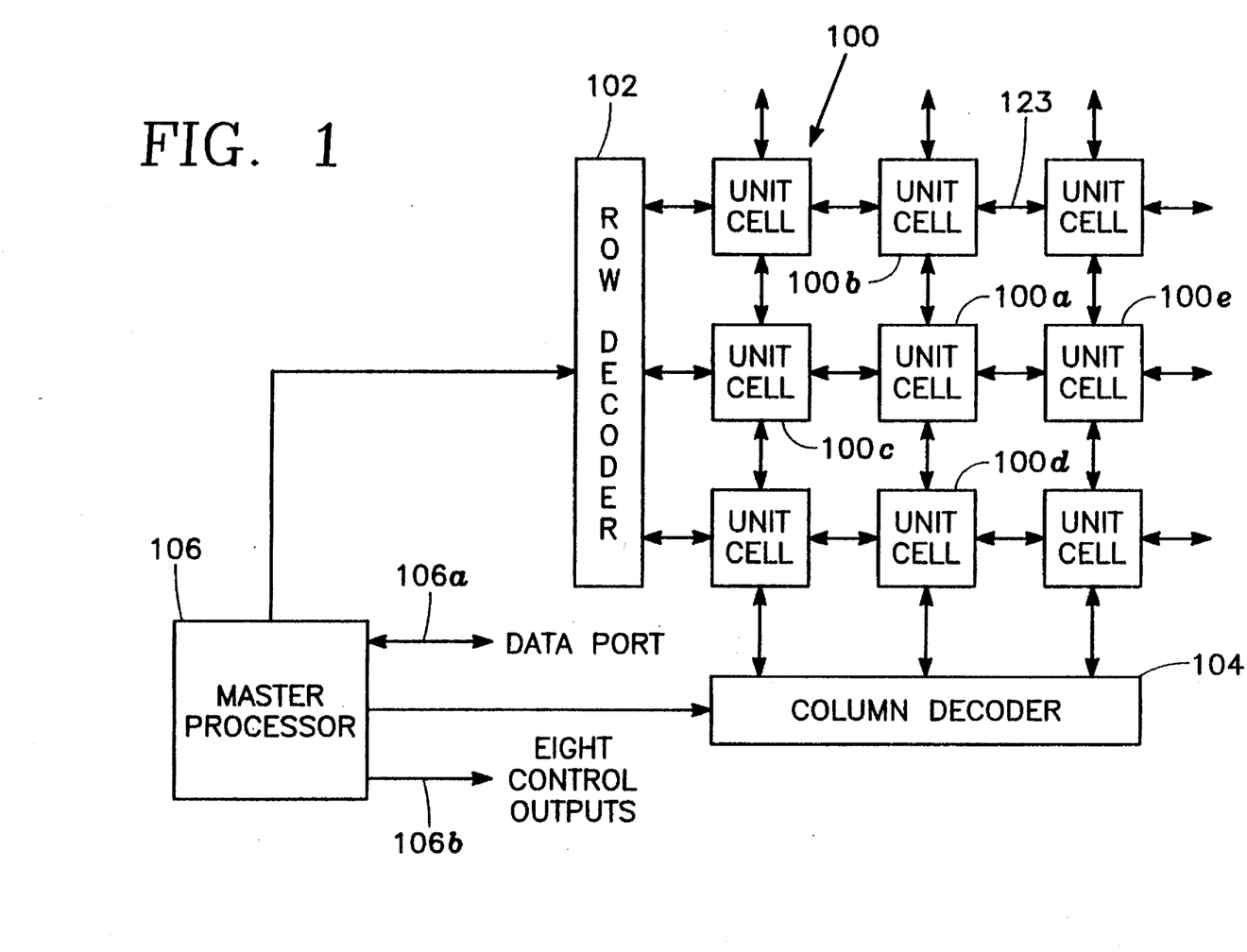
FIG. 1 is a block diagram of a parallel processor array embodying the present invention.

FIG. 1 illustrates the architecture of an integrated circuit embodying the invention. A planar array of unit cells 100 is organized by rows and columns, individual cells being X-Y addressable by row and column decoders 102, 104. Each cell 100 is connected to its four neighbors in the same row and column (i.e., its nearest "north", "south", "east" and "west" neighbors). Each cell 100 responds to the first stimulus signal received from one of its four nearest neighbor cells by storing the direction from which the first stimulus signal was recieved, blocking out receipt of any further stimulus signals, waiting for a predetermined delay period previously assigned to the particular cell, and then broadcasting a stimulus signal to all four of its nearest neighbors (or at least to those nearest neighbors from which the previous stimulus signal was not first received). For example, if the cell 100a of FIG. 1 receives its first stimulus signal from cell 100b, then the cell 100a stores the "north" direction in memory, blocks out receipt of any stimulus signals which the neighboring cells 100c, 100d or 100e might attempt to transmit, waits for its assigned delay period and then broadcasts a stimulus signal to all four of its nearest neighbor cells 100b through 100e (or at least 100c through 100e).

In this manner, stimulus signals will propagate throughout the array of cells 100 of FIG. 1 from the first one of the unit cells 100 which made the first broadcast of stimulus signals. After all stimulus signals have propagated throughout the array of cells 100, a master processor 106 (which may be included on the integrated circuit or may be an off-chip device) accesses the cells 100 individually, beginning with a selected destination cell, and traces back along the path of first-received stimulus signals by reading the direction (north, south, east or west) stored in each successive cell 100 and then going to the next cell along the stored direction. The master processor 106 then stores the location of the nearest neighbor cell corresponding to the stored direction and reads the direction stored in that nearest neighbor cell. Eventually, this process leads back to the first cell from which the first stimulus was broadcast, corresponding to the starting point of the path. The list of cell locations stored by the master processor 106 defines the fastest path through the array of cells.

The foregoing process is preceded by a preparation step in which the delay time for each unit cell 100 is programmed into that cell in accordance with the topology or problem to be solved. The delay time is the "cost" of traversing that particular cell and is defined by the user. Straightforward techniques may be used, for example, to represent a certain terrain by the array of cells 100 by programming large delay times for travel up steep mountainous slopes or difficult swamp terrain in those cells located in paths of such slopes or swamp terrain. Likewise, those cells located in paths across dry hard ground would be programmed with short delay times. In this manner, all of the cells in the array 100 are programmed with delay times appropriate to their individual locations until the entire terrain has been represented or mapped in the array. Other problems involving comparative progress in multiple paths across non-isotropic topologies are solved by programming the array of cells 100 in analogous manner. Such programming is the choice of the user and so it is not the role of this specification to describe in detail any of the many possible programming schemes which may be applied to the present invention.

Figure 2:
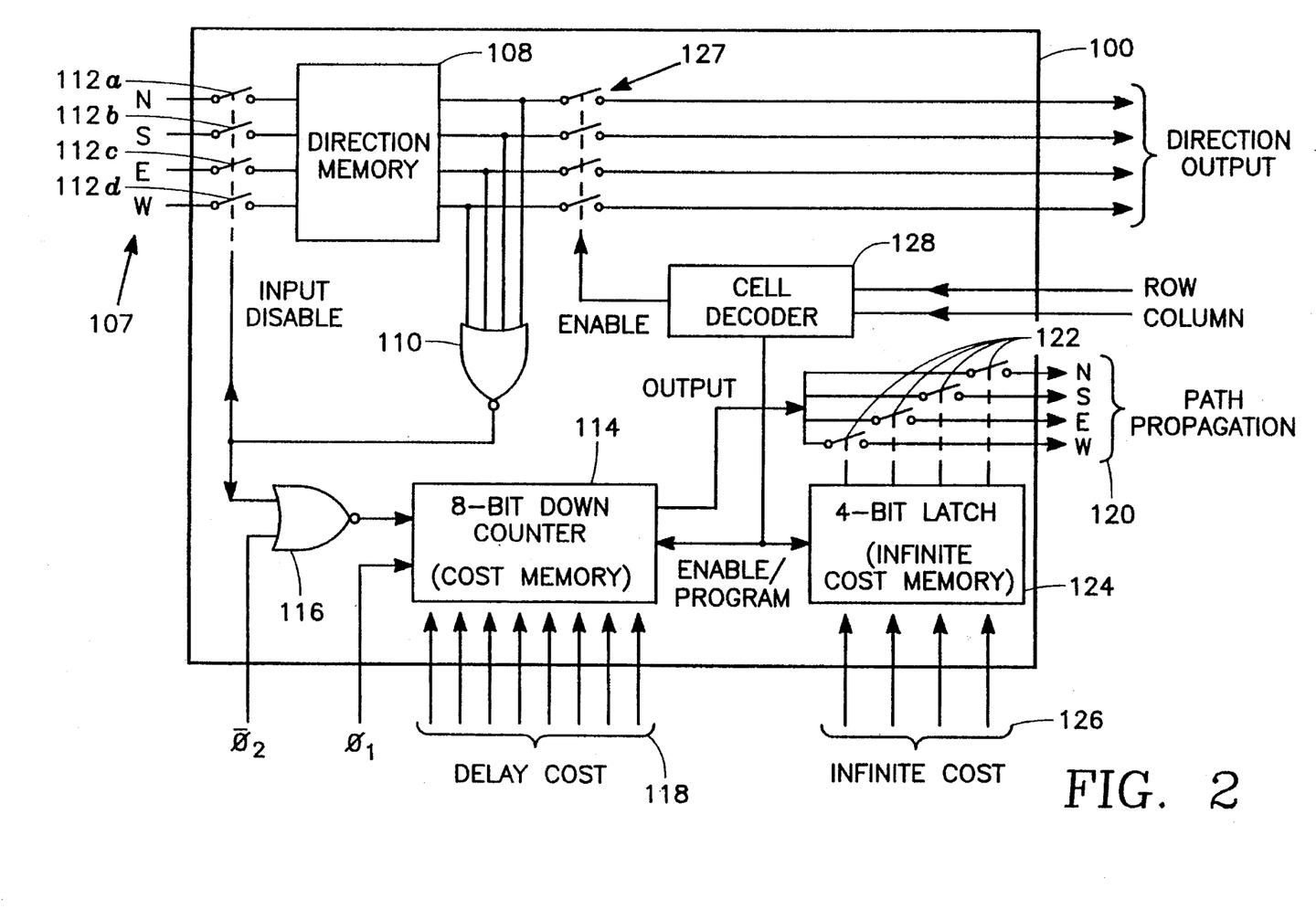
FIG. 2 is a block diagram of the architecture of a typical parallel processor cell in the array of FIG. 1.

In a preferred embodiment of the invention, the cells 100 are all identical and have the cell architecture illustrated in FIG. 2. Referring to FIG. 2, the stimulus signals received from the four nearest neighbor cells are received at four stimulus inputs 107 of a 4-bit direction memory or latch 108, the inputs 107 being labelled in FIG. 2 accordingly as N, S, E and W. Thus, for example, if the cell 100 of FIG. 2 were the cell 100a of FIG. 1, then the four inputs to the direction memory 108 would be connected to outputs of the neighbor cells 100b, 100c, 100d and 100e respectively. Each bit of the 4-bit direction memory 108 is connected to one of the four inputs and is initially in a logic-zero state. When a stimulus signal is received at one of the four inputs, the corresponding bit of the 4-bit direction memory 108 transforms to a logic-one state. A NOR logic gate 110 connected to all bits of the 4-bit direction memory 108 responds to this change of state by causing all four input disable switches 112a through 112d at the inputs to the 4-bit latch to open whenever any bit of the 4-bit direction memory 108 is in a logic-one state. All subsequent stimulus signals are ignored, so that the direction memory 108 functions as a memory of the direction from which the first stimulus signal was received.

Simultaneously with opening the input disable switches 112, the output of the NOR logic gate 110 activates an 8-bit ripple counter 114 through a second NOR logic gate 116, as follows. The NOR gate 116 permits an inverse clock signal $\bar{\phi}_2$ to be received as a clock signal $\phi_2$ at a clock input of the 8-bit ripple counter 114 only after the output of the NOR logic gate 110 goes to a logic-zero state, (i.e., when a stimulus signal is received by the direction memory 108). A complementary clock signal 91 is constantly applied to a second clock input of the 8-bit ripple counter 114. The ripple counter 114 requires complementary clock signals at both of its clock inputs to operate and therefore begins counting down from a previously loaded count value only after it begins receiving the clock signal $\phi_2$ via the NOR logic gate 116 (i.e., when the stimulus signal is received at the direction memory 108).

It should be noted here that, prior to the operation being described, the count value referred to above is first loaded or programmed into the 8-bit ripple counter 114 via eight 1-bit input lines 118. The 8-bit ripple counter 114 consists of a series of eight successive counter stages, each stage including a binary latch. All eight latches are programmed in parallel via the eight input lines 118 with individual binary values defining an 8-bit binary number representing the cost or delay value of the cell. How that delay value is selected for an individual cell in accordance with its location in the array has been discussed above herein.

Continuing now with the description of the operation, as soon as the ripple counter 114 reaches a count of zero (i.e., all eight stages thereof are in a logic-zero state), the ripple counter 114 outputs a logic-one signal to four stimulus outputs 120 (labelled "N", "S", "E" and "W" in FIG. 2) via four respective switches 122. The four stimulus outputs 120 are individually connected to respective stimulus inputs 112 of the four nearest neighbor cells. Thus, the four links 123 between the cell 100a (for example) and its four nearest neighbor cells 100b–100e in FIG. 1 consist of two signal paths, namely a connection from each output 120 of the cell 100a to the input 107 of a respective one of the neighbor cells 100b–100e and a connection from the output 120 of each neighbor cell 100b–100e to a respective one of the inputs 107 of the cell 100a.

The states of the switches 122 are controlled by the contents of a 4-bit latch comprising an infinite cost memory 124. Each cell of the memory 124 controls one of the switches 122 and determines whether that switch is opened or closed. The cost of traversing the cell 100 in a direction for which one of the switches 122 is open is infinite. The purpose in providing such an infinite cost memory is to permit the solution of problems having topologies with impassable barriers. The states of all four bits of the infinite cost memory 124 are set or programmed in parallel via four input lines 126.

Programming the cost into the cost memory 114, programming the infinite cost into the infinite cost memory 124 and reading out the stored direction from the direction memory 108 via four enable switches 127 is facilitated by a cell decoder 128 which receives row and column select signals from the row and column decoders 102, 104. If the cell decoder 128 senses the presence of enable signals from both the row and column decoders 102, 104 simultaneously, then that particular one of the cells 100 has been selected, and the master processor 106 is permitted to either input the cost value to the input lines 118, input the infinite cost value to the inputs 126 or receive the stored direction from the direction memory 108 via the switches 127 in the selected cell.

Figure 3:
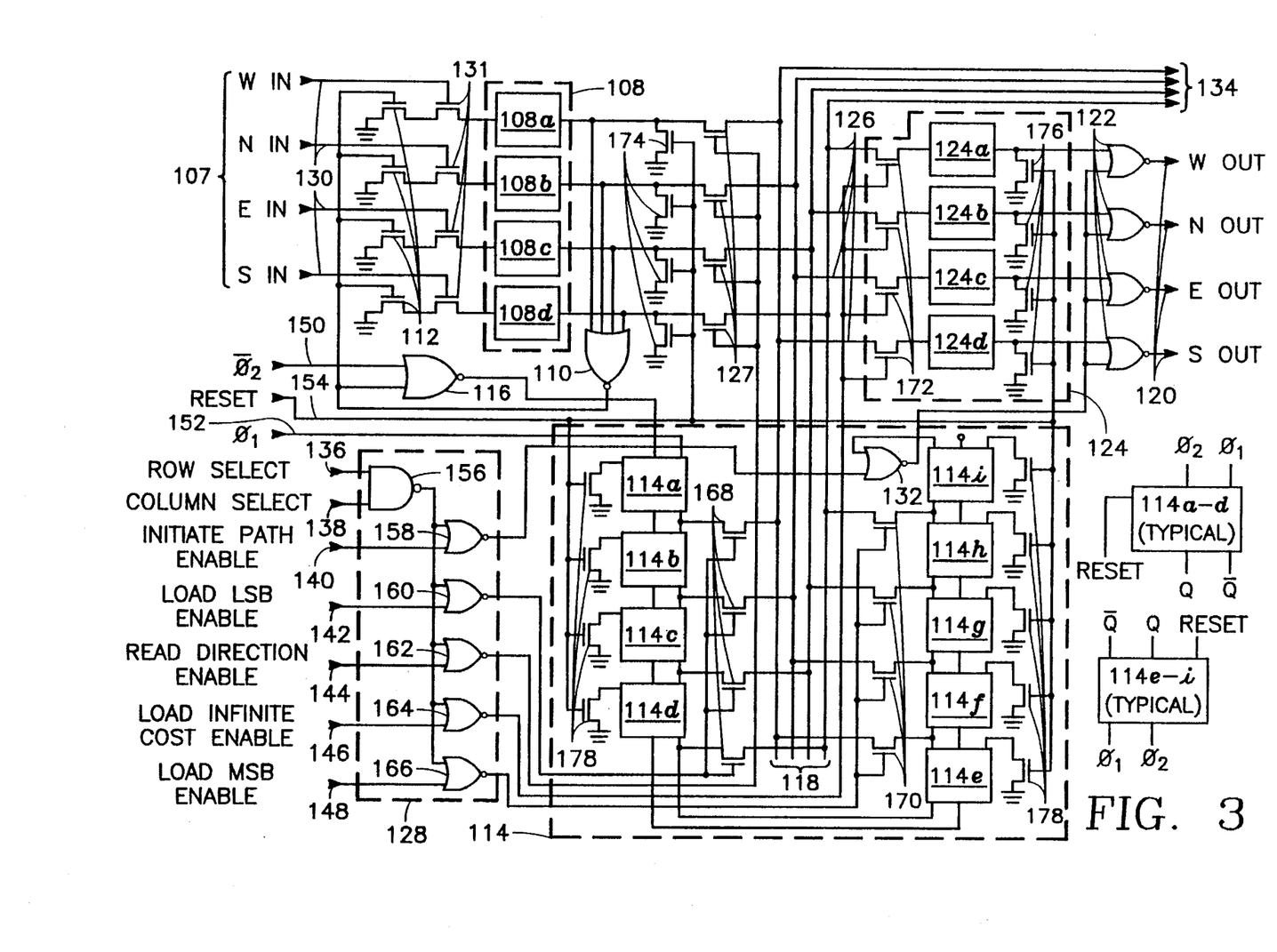
FIG. 3 is a logic diagram corresponding to the architecture of FIG. 2.

FIG. 3 illustrates a preferred circuit implementation of the cell architecture of FIG. 2. The inputs 107 constitute four input lines 130 and are connected to four MOSFET switches 131. The enable switches 112 are MOSFET devices. The direction memory 108 constitutes four static latches 108a–108d. The 8-bit ripple counter 114 (or cost memory) constitutes nine conventional ripple counter stages or cells 114a–114i, the first cell 114a corresponding to the least significant bit and the eighth cell 114h corresponding to the most significant bit. The ninth cell 114i is an extra cell constituting an output or "flip" bit which reaches a logic-zero state only after all previous counter cells 114a–114h reach a logic-zero state. As indicated in the drawing, the $\phi_1$ and $\phi_2$ inputs of the first counter cell 114a are connected to receive the complementary clock signals $\phi_1$ and $\phi_2$ while the $\phi_1$ and $\phi_2$ inputs of each of the remaining cells 114b–114i are connected to the $\bar{Q}$ and Q outputs, respectively, of each preceding cell.

In addition, a NOR logic gate 132 having one input connected to the $\bar{Q}$ output of the ninth cell 114i and its output connected to each of the switches 122 enables a preemptive stimulus signal to be transmitted at the four outputs 120 simply by applying an enabling signal to the other input of the NOR logic gate 132. This feature enables any one of the unit cells 100 in the array of FIG. 1 to function as the starting point or starting cell of an unknown optimum path. It will be recalled that the destination point is selected by choosing another unit cell 100 in the array of FIG. 1 as the destination cell. After all stimulus signals have propagated throughout the array of FIG. 1, the optimum path is determined by tracing backwards cell-by-cell, beginning with the destination cell, following the direction stored in the direction memory 108 of each cell 100, until the starting cell is reached.

The infinite cost memory 124 consists of four static latches 124a–124d, like the direction memory 108. Each one of the switches 122 at the outputs of the infinite cost memory 124 is a NOR logic gate having one input connected to the output of the NOR logic gate 132, a second input connected to a corresponding output of the infinite cost memory 124 and its output connected to a corresponding one of the stimulus signal outputs 120.

Data loading and retrieval in the cell 100 by the master processor 106 of FIG. 1, including loading the delay cost or count value into the cost memory 114, loading the infinite cost memory 124 (i.e., setting each one of the four latches 124a–124d) and reading out the direction stored in the direction memory 108 (i.e., detecting the state of each of the latches 108a–108d) is done via four data input/outputs 134 (constituting tri-state latches) under control of the cell decoder 128. For this purpose, eight control inputs to the cell decoder 128 are provided, including a row select input 136, a column select input 138, an initiate path enable input 140, a load LSB enable input 142, a read direction enable input 144, a load infinite cost enable input 146 and a load LSB enable input 148. Additional control inputs to the cell 100 include the $\bar{\phi}_2$ and $\phi_1$ clock inputs 150, 152 and a reset input 154. The control inputs 150, 152, 154 are commonly connected to all cells 100 of the array of FIG. 1, whereas the other control inputs are selectively enabled on a cell-by-cell basis as described in the following paragraph below. While the present description refers to a simple universal reset feature, in a preferred embodiment, the reset input 154 is activated on a cell-by-cell basis.

A NAND logic gate 156 of the cell decoder 128 receives a row select signal from the row decoder 102 of FIG. 1 and a column select signal from the column decoder 104 of FIG. 1 via the row and column select inputs 136, 138. Whenever both of these inputs are at logic-zero states, the output of the NAND logic gate 156 enables control NOR logic gates 158–166 connected to respective ones of the control inputs 140–146. If the initiate path enable input 140 is at a logic-zero state, then the NOR logic gate 158 applies an enabling logic signal to the NOR logic gate 132 of the cost memory 114, causing the cell 100 to preemptively broadcast a stimulus signal on its four outputs 120, thereby making that cell the starting point of an unknown optimum path. If the load LSB enable input 142 is at a logic-zero state, then the NOR logic gate 160 applies an enabling signal to four MOSFET switches 168 connecting the four least significant (LSB) cells 114a–114d via the data lines 118 to the four data input/outputs 134, causing the LSB cells to be set to the logic states then present on the four data input/outputs 134. If the load MSB enable input 148 is in a logic-zero state, then the NOR logic gate 166 applies an enabling signal to four MOSFET switches 170 connecting the four most significant bit (MSB) cells 114e–114h via the data lines 118 to the four data input/outputs 134, causing the MSB cells to be set to the logic states then present on the four data input/outputs 134. If the read direction enable input 144 is at a logic-zero state, then the NOR logic gate 162 applies an enabling signal to the four MOSFET switches 127, thereby connecting the outputs of the four direction memory latches 108a–108d to the four data input/outputs 134, permitting the master processor 106 to determine which one of the four latches 108a–108d is in a logic-zero state (i.e., to "read" the stored direction). If the load infinite cost enable input 146 is at a logic-zero state, then the NOR logic gate 164 applies enabling signals to four MOSFET switches 172, thereby connecting the four infinite cost memory latches 124a–124d to the four input/outputs 134, causing these four latches to be set in accordance with the current logic states of the four data input/outputs 134 (applied by the master processor 106). If the reset input 154 is at a logic-zero state, then MOSFET switches 174 ground the outputs of the direction memory latches 108a–108d, resetting these latches, while MOSFET switches 176 ground the outputs of the infinite cost memory latches 124a–124d, resetting these latches. Simultaneously, MOSFET switches 178 ground the reset terminals of the ripple counter cells 114a–114i, thus resetting these cells.

The connections to the cells 100 include the links 123 of FIG. 1 carrying the cell-to-cell connections for the stimulus signal inputs 107 and outputs 120. In addition, four common data lines connected to the four input/outputs 134 of each cell 100 run throughout the array of FIG. 1 and are connected to data port 106a of the master processor 106. Further, three common connections run to all cells 100 in the array, including connections to the reset input 154 and the two clock inputs 150, 152. A row line connects each row select input 136 of all cells 100 of FIG. 1 in the same row to a respective output bit of the row decoder 102 while a column line connects each column select input 138 of all cells in the same column to a respective output bit of the column decoder 104. Finally, five control lines connect five control outputs 106b of the master processor 106 to the five control inputs 140, 142, 144, 146 and 148 of every cell 100 in the array of FIG. 1.

Figure 4:
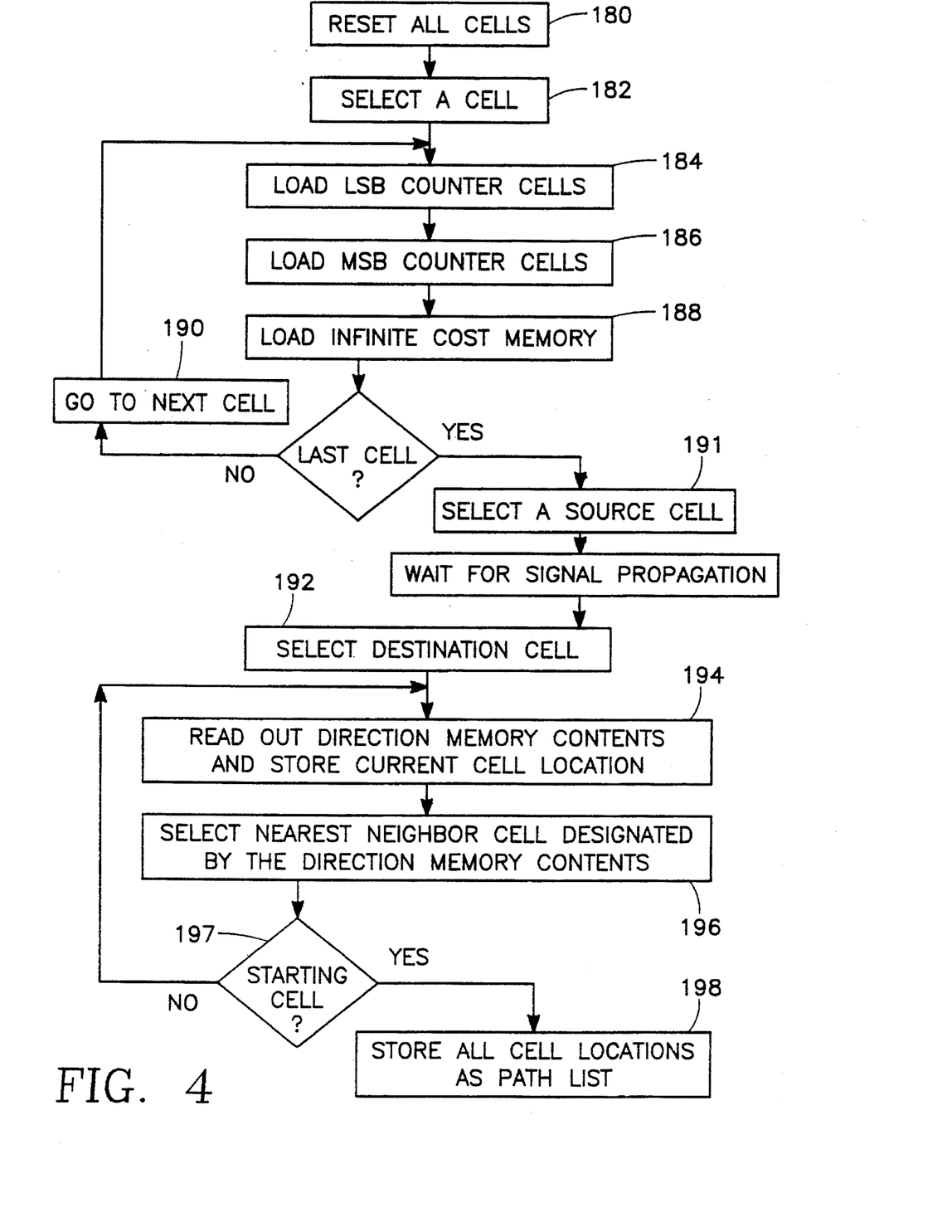
FIG. 4 is a block flow diagram illustrating the process performed by the parallel processor array of FIG. 1.

The array of cells 100 of FIG. 1 is operated by the master processor 106 in accordance with the flow block diagram of FIG. 4 as follows: a logic-zero signal is briefly applied to the reset inputs 154 of all cells 100 simultaneously to reset all of the cells 100 (block 180 of FIG. 4). Then, using the row and column decoders 102, 104, the master processor 106 selects each individual cell 100, one cell at a time, by temporarily raising both the row and column select inputs 136, 138 of the selected cell to a logic-zero state (block 182 of FIG. 4). During the time that a particular cell 100 is selected (i.e., while both the row and column select inputs to that cell are in logic-zero states), the master processor 106 temporarily sets successive ones of the control inputs 142, 148 and 146 to logic-zero states while applying appropriate logic states on the data input/outputs 134. Thus, while the load LSB enable input 142 is at a logic-zero state, the data input/outputs 134 are set to logic states corresponding to a four-bit byte to be loaded into the four LSB cells of the cost memory 114 (block 184 of FIG. 4). While, the load MSB enable input 148 is at a logic-zero state, the data input/ outputs 134 are set to logic states corresponding to a four-bit byte to be loaded into the four MSB cells of the cost memory 114 (block 186 of FIG. 4). While the load infinite cost memory enable input 146 is at a logic-zero state, the data input/outputs 134 are set to logic states corresponding to a four-bit byte to be loaded into the infinite cost memory 124 (block 188 of FIG. 4). If all four directions through the particular cell 100 are traversable with a finite cost, then this byte consists of four zeroes. The next cell is selected (block 190 of FIG. 4) and the foregoing steps are repeated until all cells 100 in the array have been programmed.

Next, one of the cells 100 is selected (block 191 of FIG. 4) as the starting cell of an optimum path to be determined, and the master processor 106 temporarily sets the initiate path enable input 140 of that cell to a logic zero, thereby beginning the propagation of stimulus signals throughout the array of cells 100. Then, the system waits until, eventually, such propagation ceases because the blocking switches 112 of all cells 100 ultimately become open. At this point, the master processor 106 selects a particular one of the cells 100 (other than the starting cell) as the destination cell (block 192 of FIG. 4) and begins tracing back through the optimum path in accordance with the direction stored in the direction memory 108 of each cell. The destination cell is selected by enabling its cell decoder 128 (block 192 of FIG. 4), applying a logic-zero signal to the cell's read direction enable input 144 and sensing the logic states or data on the data input/outputs 134 (block 194 of FIG. 4). The master processor 106 then determines from the sensed data (i.e., the stored direction) which one the cell's four nearest neighbors to address in the same manner. The one nearest neighbor cell corresponding to the stored direction is then selected (block 196 of FIG. 4) and its direction memory read in the foregoing manner. This process is repeated until the starting point or starting cell is reached (block 197). As each cell is thus sequentially addressed, the master processor 106 stores that cell's location (in block 194 of FIG. 4), so that at the end of the process the master processor 106 stores a cell list identifying the optimum path through the cell array of FIG. 1 (block 198 of FIG. 4).

Figure 5:
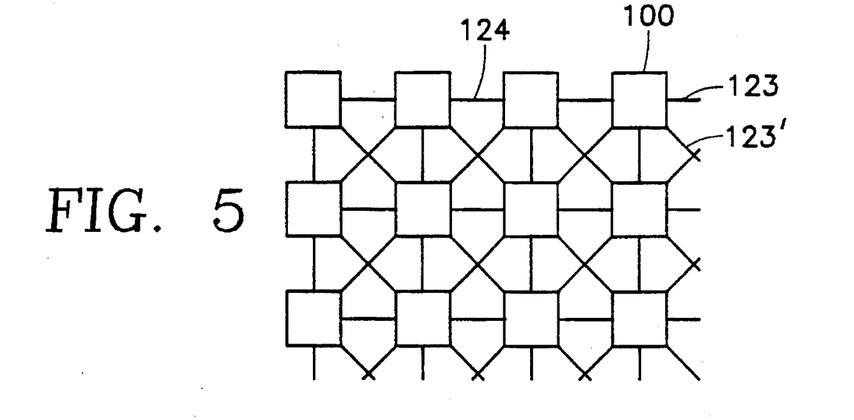
FIG. 5 is an alternative embodiment of an array of parallel processor cells providing greater resolution for path planning.

FIG. 5 illustrates a preferred embodiment of the invention in which each cell 100 is orthogonally connected to its nearest four neighbors (N,S,E,& W) via the orthogonal links 123 as in FIG. 1 and is diagonally connected to its four next nearest neighbors (NW,SW,NE & SE) via diagonal links 123'. This embodiment provides greater resolution in defining a path topology for a given number of cells 100.

Figure 6:
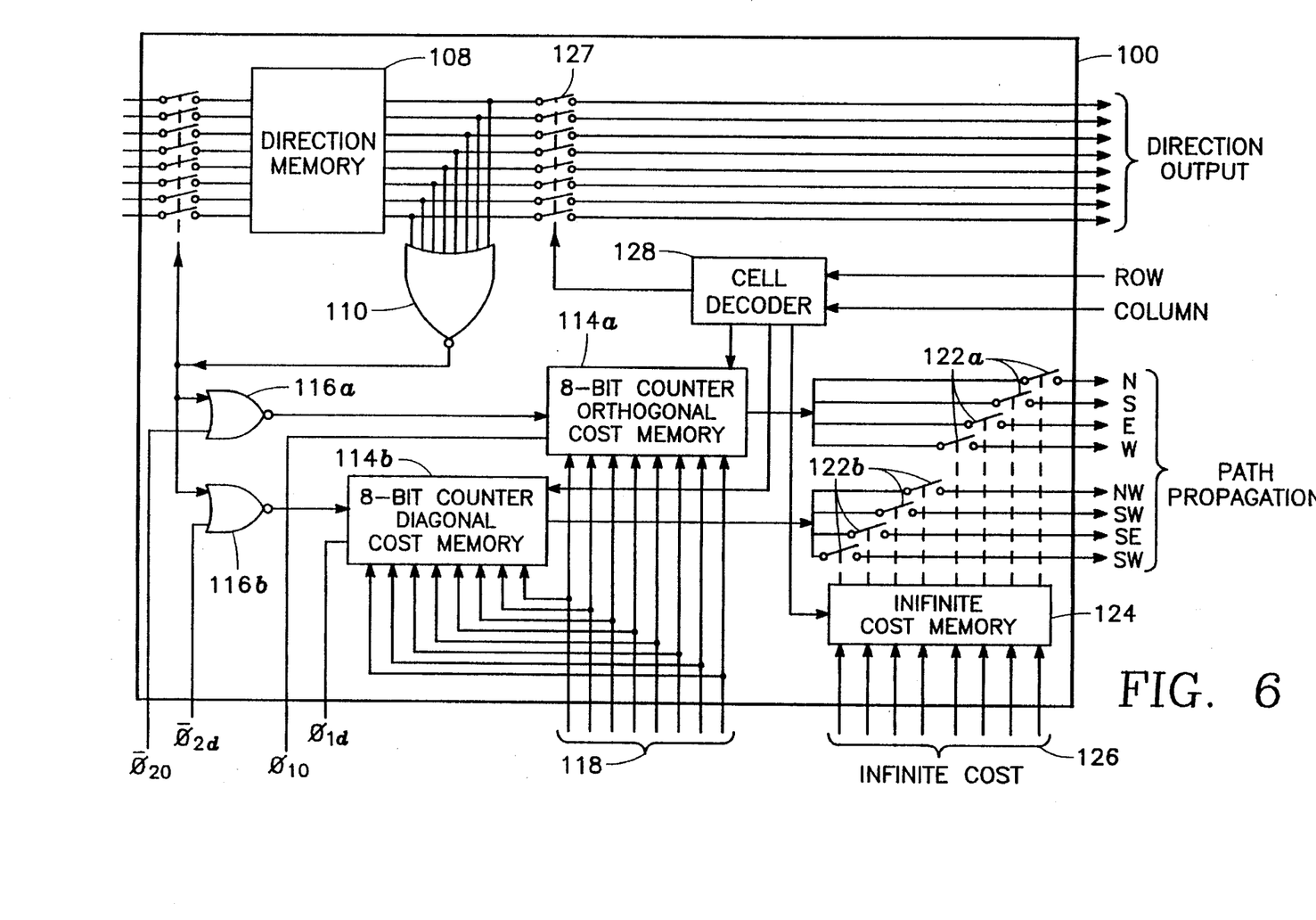
FIG. 6 is a block diagram of the architecture of a typical parallel processor cell in the array of FIG. 5.

FIG. 6 illustrates the cell architecture corresponding to the embodiment of FIG. 5. The main difference between the cell architectures of FIGS. 2 and 6 is that in FIG. 6 two cost memories are provided, namely an orthogonal cost memory 114a controlling stimulus propagation along the orthogonal links 123 (corresponding to the cost memory 114 of FIG. 2) and a diagonal cost memory 114b controlling stimulus propagation along the diagonal links 123'. The delay costs or counts loaded into the orthogonal and diagonal cost memories 114a, 114b should differ by a factor of about √2, reflecting the difference between the lengths of the orthogonal and diagonal links 123, 123'. Another difference is that there are twice the number of inputs and outputs of the direction memory 108 and twice the number of path propagation outputs via the links 123, 123', the N,S,E and W (orthogonal) stimulus signal outputs being controlled by the orthogonal cost memory 114a and the NE, NW, SE and SW (diagonal) stimulus signal outputs being controlled by the diagonal cost memory 114b. Further, the infinite cost memory 124 has twice the number of bits in order to individually control the signal stimulus outputs. Two separate clock signal pairs $\phi_{1o}$, $\bar{\phi}_{2o}$ and $\phi_{1d}$, $\bar{\phi}_{2d}$ are provided separately through two different NOR logic gates 116a, 116b (corresponding to the NOR logic gate 116 of FIG. 1) to the two cost memories 114a, 114b. For example, by operating the different clock signal pairs sequentially, a single set of data lines 118 suffices to load separate values into the two memories 114a, 114b. Also, the two memories may be operated at slightly different clock speeds to vary relative costs differences between the orthogonal and diagonal directions.

Figure 7:
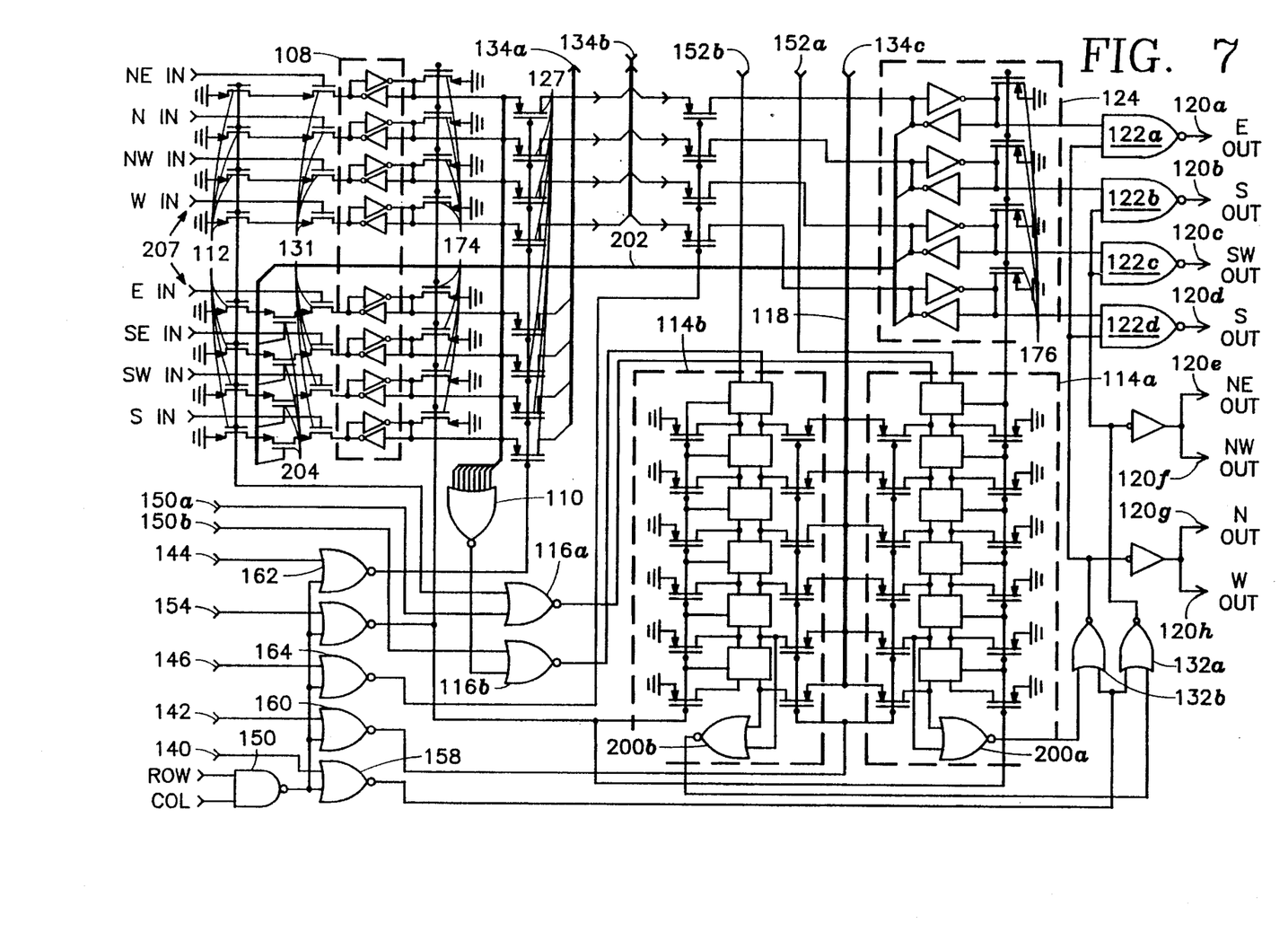
FIG. 7 is a logic diagram corresponding to FIG. 6.

A preferred circuit implementation of the cell architecture of FIG. 6 is illustrated in FIG. 7. In the embodiment of FIG. 7, the data input/outputs 134 include a data I/O 134a dedicated to the four least significant bits of the direction memory 108, a data I/O 134b dedicated to the four most significant bits of the direction memory 108 and to the four bits of the infinite cost memory 124 and a data I/O 134c dedicated to and shared by the cost memories 114a and 114b via the data input lines 118. The clock inputs 150, 152 are split into clock inputs 150a, 150b and 152a, 152b so that the two cost memories 114a, 114b may be operated independently, as discussed above with reference to FIG. 6. In the implementation of FIG. 7, the infinite cost memory 124 can impose infinite costs only in four of the eight directions in FIG. 7, namely E, SE, S and SW corresponding to outputs 120a–120d. As shown in the drawing of FIG. 7, four NOR logic gates 122a–122d control the outputs 120a–120d in response to the outputs of respective ones of the cost memories 114a, 114b and respective ones of the cells of the infinite cost memory 124.

Two NOR logic gates 132a, 132b perform the function of the NOR logic gate 132 of FIG. 3 for respective ones of the two cost memories 114a, 114b. The orthogonal and diagonal cost memories 114a, 114b, which are ripple counters, include respective NOR logic gates 200a, 200b, each input thereof being connected to the two most significant bits or cells of the corresponding ripple counter or cost memory. The NOR logic gates 200a, 200b are in lieu of an extra "flip" bit in the counter (described previously with reference to FIG. 3). When either counter 114a or 114b has counted down to zero, the respective NOR gate 200a or 200b outputs an enabling signal to the corresponding one of the two NOR gates 132a, 132b, causing a stimulus signal to be transmitted on corresponding ones of the outputs 120, unless blocked by one of the gates 122. The NE, NW, N and W outputs 120e–120h are not blockable (as discussed above) and therefore require only a pair of inverters, as indicated in the drawing of FIG. 7.

An additional feature of the embodiment of FIG. 7 is that the blocking of a stimulus signal output by the infinite cost memory 124 in a particular direction also blocks receipt of any stimulus signal from that same direction. This is accomplished by a four bit bus 202 connected to the four inputs of the infinite memory cell latches 124a–124d, the bus 202 controlling four MOSFET switches 204. If any one of the MOSFET switches 204 is closed (due to a corresponding one of the infinite memory latches 124a–124d being programmed "ON"), then the corresponding stimulus signal input 207 is disabled, so that any stimulus signal received along that direction is blocked. This simulates a barrier to travel in both directions along a given link 123 or 123'.

Figure 8:
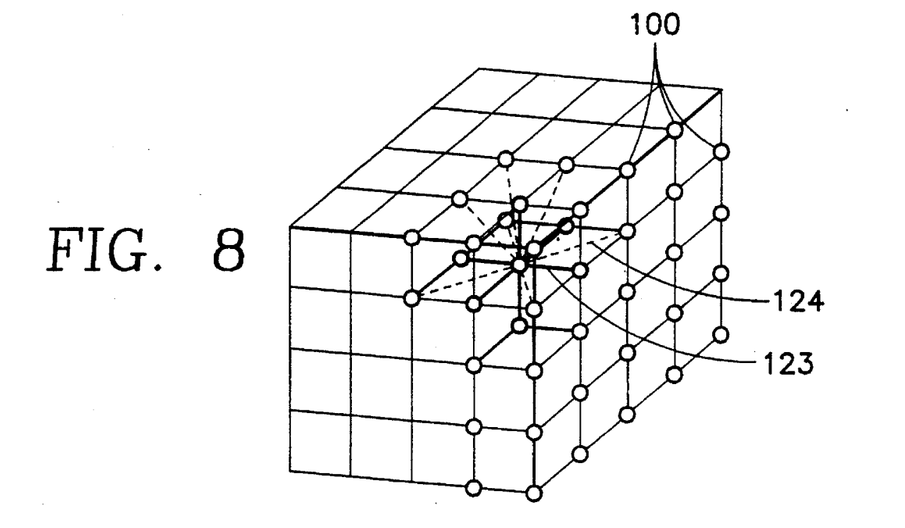
FIG. 8 is a block diagram of a three-dimensional array of parallel processor cells in another alternative embodiment of the invention.
Figure 9:
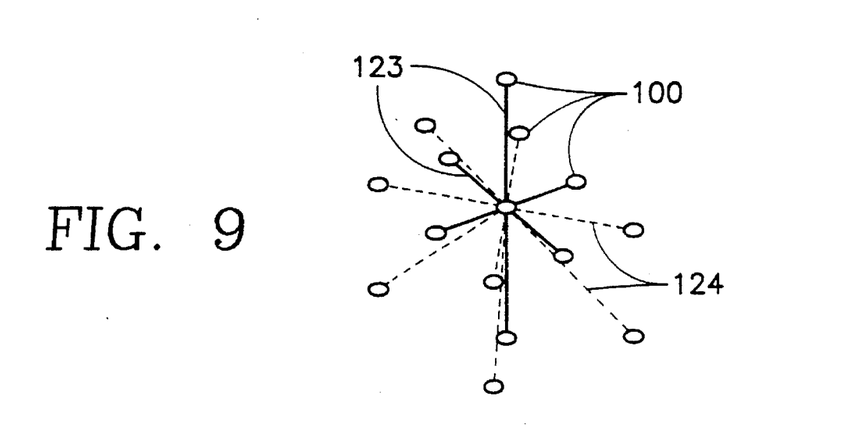
FIG. 9 is a diagram of a portion of the three-dimensional array of FIG. 8.

FIG. 8 illustrates how the architectures of FIGS. 6 and 7 can be extended to a three-dimensional topology. FIG. 9 illustrates a "unit cell" and its nearest orthogonal and diagonal neighbors in the architecture of FIG. 8. The solid-line links 123 of FIG. 8 provide orthogonal connections between unit cells 100, like the two-dimensional embodiment of FIG. 1. However, in this case there are six links 123 instead of four for each cell 100, requiring a larger number of bits in the direction memory 108 and in the infinite cost memory 124 using the architecture of FIG. 3.

The dashed-line links 124 provide connection between each cell 100 and its nearest diagonal neighbor cells. In this case, each individual cell has six orthogonal links 123 and eight diagonal links 123', for a total of fourteen directions. Here, using the architecture of FIG. 7, implementation would require increasing the number of orthogonal direction stimulus signal inputs and outputs by two, doubling the number of diagonal direction inputs and outputs and increasing the size of the direction memory 108 to 14 bits. Routing of the fourteen links 123, 123' of each cell 100 would require more space on the integrated circuit.

In either the two-dimensional embodiment of FIG. 5 or the three-dimensional embodiment of FIG. 8, the number of directions per cell 100 may be increased by linking not only to the first layer neighbor cells provided by the orthogonal links 123 and to the second layer cells provided by the diagonal links 123', but also to tertiary layer neighbors, as but one further example. The links to such tertiary neighbors would lie at 30-degree angles with respect to the adjacent orthogonal links 123.

Preferably, the embodiment of FIG. 1 is implemented in an integrated circuit employing standard VLSI digital circuit design techniques. The three dimensional embodiment corresponding to FIG. 8 may be implemented as a complex VLSI digital circuit employing such well-known techniques as wafer scale integration. However, the invention is not limited to implementations using digital circuitry to perform the arithmetic functions described herein.

While the invention has been described in detail by specific reference to preferred embodiments thereof, it is understood that variations and modifications may be made without departing from the true spirit and scope of the invention.

What is claimed is:

1. A path planning parallel processor, comprising:
   (A) a two dimensional array of processor cells, each of said processor cells comprising:
      (1) plural direction input means for receiving stimulus signals from neighboring processor cells along corresponding directions in said array,
      (2) direction memory means for determining and storing the identity of a direction along which a stimulus signal is first received,
      (3) means for broadcasting a subsequent stimulus signal to said neighboring processor cells after a locally stored predetermined delay time, wherein said predetermined delay time corresponds to a topology, whereby stimulus signals propagate throughout said array from a starting one of said processor cells;
   (B) link means for carrying stimulus signals between neighboring processor cells; and
   (C) means for tracing back from a user selected destination one of said processor cells to said starting cell along an optimum path of said processor cells in accordance with said identity of a direction stored in each of said processor cells.

2. The parallel processor of claim 1 further comprising:
   hardware means external to said processor cells operable prior to propagation of said stimulus signals throughout said array for programming different predetermined delay times in different ones of said processor cells in accordance with said topology across which said optimum path is to be determined.

3. The parallel processor of claim 2 wherein each of said processor cells further comprises:
   hardware means for causing said starting cell to preemptively broadcast a stimulus signal to its neighboring processor cells.

4. The parallel processor of claim 3 wherein:
   said means for broadcasting comprises programmable cost memory means for storing said predetermined delay time, and
   said means for programming comprises means for writing said predetermined delay time to said programmable cost memory.

5. The parallel processor of claim 4 wherein:
   each of said processor cells further comprises infinite cost memory means for storing cost values and for preventing a stimulus signal from being transmitted from said cell along at least a selected one of said directions, whereby to impose an infinite time delay for said selected one direction corresponding to an impassable barrier of said topology.

6. The parallel processor of claim 5 wherein said means for broadcasting and said programmable cost memory means comprise:
   a first ripple down counter having an output connected to said link means, and
   a count enable input connected to said direction memory means,
   wherein said first ripple down counter comprises means for counting down from a preset count stored therein upon receipt by said direction memory means of a stimulus signal,
   and wherein said means for programming comprises means for setting said count stored in said first ripple down counter to a count value corresponding to the predetermined delay time of the cell.

7. The parallel processor of claim 6 wherein said infinite cost memory means comprise:
   programmable means for interrupting connection between said first ripple down counter output and link means of selected ones of said directions corresponding to said impassable barrier.

8. The parallel processor of claim 6 wherein said means for programming further comprises:
   means for programming said infinite cost memory with the identity of the directions along which said programmable means is to interrupt connection between said first ripple down counter and said link means.

9. The parallel processor of claim 5 wherein said infinite cost memory means further comprises:
   means for blocking receipt of any stimulus signals along selected directions.

10. The parallel processor of claim 5 wherein said means for programming and said means for tracing back comprise:
    a master processor programmed to program said cost memory means and said infinite cost memory means prior to a propagation of stimulation signals throughout said array and to initiate broadcasting of a stimulus signal from said starting cell and to trace back said optimum path; and
    row and column decoder means controlled by said master processor and connected to respective processor cells in respective row and columns of said array for accessing selected ones of said processor cells for said master processor.

11. The parallel processor of claim 10 wherein each of said processor cells further comprises:
    cell decoder means connected to said row and column decoder means for sequentially enabling programming of said cost memory means and said infinite cost memory means and reading of said direction memory means upon receipt by said cell decoder of enabling signals from said row and column decoder means.

12. The parallel processor of claim 5 wherein said neighboring processor cells comprise:
    nearest neighbor processor cells disposed in orthogonal directions with respect to said cell, and
    next-nearest neighbor processor cells disposed in diagonal directions with respect to said cell,
    wherein said cost memory means comprises an orthogonal cost memory and a diagonal cost memory, and wherein said means for programming comprises means for programming one time delay in said orthogonal cost memory and an other time delay into said diagonal cost memory.

13. The parallel processor of claim 12 wherein each of said diagonal and orthogonal cost memories comprises:

a ripple down counter, and means for applying separate clock signals to each ripple down counter.

14. The parallel processor of claim 4 wherein each of said processor cells further comprise:

infinite cost memory means for storing cost values and for blocking receipt of any stimulus signals along selected directions.

15. The parallel processor of claim 2 wherein said hardware means for programming different predetermined delay times in different ones of said processor cells is located within each of said processor cells.

16. The parallel processor of claim 1 wherein:

said array is a network of orthogonal rows and columns of said processor cells, and the neighboring processor cells of an individual one of said processor cells comprise processor cells which are adjacent said one processor cell along one of:
(a) orthogonal directions only,
(b) orthogonal and diagonal directions.

17. The parallel processor of claim 16 wherein:

said means for broadcasting broadcasts a stimulus signal along said orthogonal directions after said predetermined time delay and broadcasts a stimulus signal along said diagonal directions of processor cells which are adjacent said one processor cells along orthogonal and diagonal directions after an other predetermined time delay different from said predetermined time delay.

18. The parallel processor of claim 17 wherein:

said other predetermined time delay exceeds said predetermined time delay by a factor equal to a square root of two.

19. The parallel processor of claim 16 wherein said network is a three-dimensional network, wherein the third dimension corresponds to altitudes of air traveled paths.

20. The parallel processor claim 1 wherein said direction memory means comprises:

plural resettable latches connected to receive stimulus signals along respective ones of said directions;

means responsive to the setting of any one of said resettable latches by a first-received stimulus signal for blocking the receipt of any further stimulus signals along at least all others of said directions.

21. The parallel processor of claim 1 wherein:

said broadcasting means comprises means for imposing different time delays for broadcasting stimulus signals in different ones of said directions.

22. The parallel processor of claim 1 further comprising:

software means external to said processor cells operable prior to propagation of said stimulus signals throughout said array for programming different predetermined delay times in different ones of said processor cells in accordance with said topology across which said optimum path is to be determined.

23. The parallel processor of claim 22 wherein said software means for programming different predetermined delay times in different ones of said processor cells is located within each of said processor cells.

24. A method of path planning in an array of parallel processor cells interconnected between neighboring processor cells by link means, comprising:

(A) in each cell:
(1) receiving stimulus signals from neighboring processor cells along corresponding directions in said array,
(2) determining and storing the identity of a direction along which a stimulus signal is first received,
(3) broadcasting a subsequent stimulus signal to said neighboring processor cells after a predetermined delay time, whereby stimulus signals propagate throughout said array from a starting one of said processor cells;

(B) after propagation of said stimulus signals throughout said array, tracing back from a selected destination one of said processor cells to said starting cell along an optimum path of said processor cells in accordance with said identity of a direction stored in each of said processor cells.

25. The method of claim 24 further comprising:

prior to propagation of said stimulus signals throughout said array, programming different predetermined delay times in different ones of said processor cells in accordance with a topology across which said optimum path is to be determined.

26. The method of claim 25 further comprising:

causing said selected starting cell to preemptively broadcast a stimulus signal to its neighboring processor cells.

27. The method of claim 26 wherein:

said broadcasting is preceded by reading said predetermined delay time from a programmable cost memory, and said programming comprises writing said predetermined delay time to said programmable cost memory.

28. The method of claim 27 further comprising:

preventing a stimulus signal from being transmitted from said cell along at least a selected one of said directions, whereby to impose an infinite time delay for said selected one direction corresponding to an impassable barrier of said topology.

29. The method of claim 28 further comprising:

blocking receipt of any stimulus signals along selected directions.

30. The method of claim 28 wherein said programming and said tracing back comprise:

programming cost memory means and infinite cost memory means with said time delay and said identification of directions corresponding to impassable barriers, respectively, prior to a propagation of stimulation signals throughout said array from a master processor accessing individual processor cells from row and column decoder means;

initiating broadcasting of a stimulus signal from said starting cell under control of said master processor;

reading said stored direction of successive processor cells to said master processor while tracing back said optimum path whereby to construct a list of cell locations along said optimum path.

31. The method of claim 30 further comprising sequentially enabling:

(a) programming of said cost memory means, (b) programming of said infinite cost memory means, and (c) reading of said direction memory means upon receipt by said cell decoder of enabling signals from said row and column decoder means.

32. The method of claim 28 wherein:

said neighboring processor cells comprise nearest neighbor processor cells disposed in orthogonal directions with respect to said cell and next-nearest neighbor processor cells disposed in diagonal directions with respect to said cell, said cost memory means comprises an orthogonal cost memory and a diagonal cost memory, and said programming comprises programming one time delay in said orthogonal cost memory and an other time delay into said diagonal cost memory.

33. The method of claim 24 wherein:

said array is a network of orthogonal rows and columns of said processor cells, and the neighboring processor cells of an individual one of said processor cells comprise processor cells which are adjacent said one cell along one of:
(a) orthogonal directions only,
(b) orthogonal and diagonal directions.

34. The method of claim 33 wherein said broadcasting comprises:

broadcasting a stimulus signal along said orthogonal directions after said predetermined time delay, and broadcasting a stimulus signal along said diagonal directions after an other predetermined time delay different from said predetermined time delay.

35. The method of claim 34 wherein:

said other predetermined time delay exceeds said predetermined time delay by a factor equal to a square root of two.

36. The method of claim 33 wherein said network is one of:
(a) a two-dimensional network, and
(b) a three-dimensional network.

37. The method claim 24 further comprising:

blocking the receipt of any further stimulus signals along at least all others of said directions upon receipt of a stimulus signal in one direction.

38. The method of claim 24 further comprising:

imposing different time delays for broadcasting stimulus signals in different ones of said directions.

39. The method of claim 38 wherein:

said neighboring processor cells comprise nearest neighbor processor cells disposed in orthogonal directions with respect to said cell and next-nearest neighbor processor cells disposed in diagonal directions with respect to said cell, said programming comprises programming one time delay for broadcasting in said orthogonal directions and an other time delay for broadcasting in said diagonal directions from each cell.

40. The method of claim 39 wherein:

said other time delay exceeds said time delay by a factor of a square root of two.

41. A method of optimum path planning in an array of nodes, neighboring ones of said nodes being linked together so as to enable communication of stimulus signals therebetween, said method comprising:

programming a pattern of delay times into said array of nodes corresponding to a topology of a terrain to be traversed;

electronically traveling all possible paths between a starting one of said nodes and a destination one of said nodes simultaneously, wherein each of said node can only be traveled to once; and sensing which one of said paths provided the minimum travel time from said starting node to said destination node.

42. The method of claim 41 wherein said programming comprises:

programming different predetermined delay times in different ones of said nodes in accordance with a topology across which said optimum path is to be determined.

43. The method of claim 42 wherein said electronically traveling comprises performing the following steps in each node:

(1) receiving stimulus signals from neighboring nodes along corresponding directions in said array, (2) determining and storing the identity of a direction along which a stimulus signal is first received, (3) broadcasting a subsequent stimulus signal to said neighboring nodes after a predetermined delay time, whereby stimulus signals propagate throughout said array from a starting one of said nodes.

44. The method of claim 43 wherein said sensing comprises:

after propagation of said stimulus signals throughout said array, tracing back from a selected destination one of said processor cells to said starting cell along an optimum path of said processor cells in accordance with said identity of a direction stored in each of said processor cells.

45. The method of claim 42 wherein said programming further comprises:

blocking broadcasting of stimulus signals in one selected direction in a selected one of said processor cells whereby to represent an impassable barrier in said topology.

46. The method of claim 42 wherein:

said programming further comprises blocking receipt of any stimulus signals along a selected direction in a selected one of said processor cells whereby to represent an impassable barrier in said topology.

47. The method of claim 41 wherein said programming comprises:

imposing different time delays for broadcasting stimulus signals in different ones of said directions in each cell.

48. A parallel processor for optimum path planning including an array of nodes, neighboring ones of said nodes being linked together so as to enable communication of stimulus signals therebetween, said parallel processor comprising:

means for programming a pattern of delay times into said array of nodes corresponding to the topology of a terrain to be traversed;

means for electronically traveling all possible paths between a starting one of said nodes and a destination one of said nodes; and means for sensing which one of said paths provided the minimum travel time from said starting node to said destination node.

49. The parallel processor of claim 48 wherein said programming means comprises:

means for programming different predetermined delay times in different ones of said nodes in accordance with a topology across which said optimum path is to be determined.

50. The parallel processor of claim 49 wherein said means for electronically traveling comprises in each node:

(1) means for receiving stimulus signals from neighboring nodes along corresponding directions in said array, (2) means for determining and storing the identity of a direction along which a stimulus signal is first received, (3) means for broadcasting a subsequent stimulus signal to said neighboring nodes after a predetermined delay time, whereby stimulus signals propagate throughout said array from a starting one of said nodes.

51. The parallel processor of claim 50 wherein said means for sensing comprises:

means operable after propagation of said stimulus signals throughout said array for tracing back from a selected destination one of said processor cells to said starting cell along an optimum path of said processor cells in accordance with said identity of a direction stored in each of said processor cells.

52. The parallel processor of claim 49 wherein said means for programming further comprises:

means for blocking broadcasting of stimulus signals in one selected direction in a selected one of said processor cells whereby to represent an impassable barrier in said topology.

53. The parallel processor of claim 49 wherein:

said neighboring processor cells comprise nearest neighbor processor cells disposed in orthogonal directions with respect to said cell and next-nearest neighbor processor cells disposed in diagonal directions with respect to said cell, and said means for programming comprises means for programming one time delay for broadcasting in said orthogonal directions and an other time delay for broadcasting in said diagonal directions from each cell.

54. The parallel processor of claim 53 wherein:

said other time delay exceeds said time delay by a factor of a square root of two.

55. The parallel processor of claim 49 wherein:

said means for programming further comprises means for blocking receipt of any stimulus signals along a selected direction in a selected one of said processor cells whereby to represent an impassable barrier in said topology.

56. The parallel processor of claim 48 wherein said means for programming comprises:

means for imposing different time delays for broadcasting stimulus signals in different ones of said directions in each cell.

* * * * *